United States Patent
Birk et al.

(10) Patent No.: US 6,556,469 B2
(45) Date of Patent: Apr. 29, 2003

(54) SYSTEM AND METHOD FOR MULTILEVEL DRAM SENSING AND RESTORING

(76) Inventors: Gershom Birk, 1421 Lansdowne Drive, Coquitlam, BC (CA), V3E 1Y5; Duncan Elliott, University of Alberta, Edmonton, Alberta (CA), T6G 2G7; Bruce F. Cockburn, University of Alberta, Edmonton, Alberta (CA), T6G 2G7

( * ) Notice: Subject to any disclaimer, the term of this patent is extended or adjusted under 35 U.S.C. 154(b) by 0 days.

(21) Appl. No.: 09/768,006

(22) Filed: Jan. 24, 2001

(65) Prior Publication Data

US 2002/0053007 A1 May 2, 2002

Related U.S. Application Data

(63) Continuation of application No. PCT/CA00/00613, filed on May 26, 2000.

(30) Foreign Application Priority Data

May 26, 1999 (CA) .............................. 2273122

(51) Int. Cl.[7] .............................................. G11C 11/24
(52) U.S. Cl. .................... 365/149; 365/168; 365/210
(58) Field of Search ................................. 365/168, 149, 365/145, 203, 210, 205, 208, 230.03, 189.01

(56) References Cited

U.S. PATENT DOCUMENTS

| | | | |
|---|---|---|---|
| 5,283,761 A | | 2/1994 | Gillingham |
| 5,532,955 A | | 7/1996 | Gillingham |
| 5,612,912 A | | 3/1997 | Gillingham |
| 5,684,736 A | * | 11/1997 | Chan .......................... 365/149 |
| 5,859,794 A | * | 1/1999 | Chan .......................... 365/149 |
| 5,917,748 A | * | 6/1999 | Chi et al. .................... 365/168 |
| 6,137,739 A | * | 10/2000 | Kim ........................... 365/205 |
| 6,151,260 A | * | 11/2000 | Birk .......................... 365/207 |

FOREIGN PATENT DOCUMENTS

| | | |
|---|---|---|
| CA | 2273122 | 5/1999 |
| EP | 0 273 639 | 12/1987 |

OTHER PUBLICATIONS

Gershom, Birk et al., An Comparative Simulation Study of Four Multilevel DRAMs, Department of Electrical and Computer Engineering, University of Alberta.

T. Furuyama, et al., "An Experimental Two Bit/Cell Storage DRAM for Macro Cell or Memory on Logic Application", IEEE J. Solid State Circuits, vol. 24, No. 2, Apr. 1989, p.388–393.

(List continued on next page.)

Primary Examiner—Hoai Ho
Assistant Examiner—Gene N. Auduong
(74) Attorney, Agent, or Firm—Kevin Pillay; Fasken Martineau DuMoulin LLP

(57) ABSTRACT

A dynamic random access memory for storing one of N levels in each of a plurality of memory cells, the memory cells having storage capacitors coupled to bitline pairs through switches for writing and reading data to and from the memory cells, the memory comprising: at least N–1 bitline pairs, each bitline pair being divided into N–1 sub-bitlines by first switches therebetween; the sub-bitline pairs of each bitline being coupled to adjacent sub-bitline pairs by second switches therebetween, to form N–1 groups of sub-bitlines each for producing one of N–1 reference voltages; sense amplifiers coupled to each sub-bitline pair; N–1 sub-bitline pairs each having reference cells for selective coupling thereto; (N–2)(N–1) sub-bitline pairs each having generate cells for selective coupling thereto; and sub-bitline pairs being selectively connected in a group through switches such that: the sub-bitlines in the group are precharged to one of a plurality of voltages; one of the (N–1) reference voltages is generated by shorting together sub-bitlines in the group; and the reference voltage is stored in a reference cell in one of the bit-line pairs in the group.

8 Claims, 19 Drawing Sheets

OTHER PUBLICATIONS

P. Gillingham, "A Sense and Restore Technique for Multi-level DRAM", IEEE Trans. on Circuits and Systems II: Analog and Digital Signal Processing, vol. 43, No. 7, Jul. 1996.

T. Okuda et al., "A Four Level Storage for –Gb DRAM", IEEE Solid State Circuits, vol. 32, No. 11, Nov. 1997, p.1743–1747.

* cited by examiner

SYSTEM AND METHOD FOR MULTILEVEL DRAM SENSING AND RESTORING

The present invention relates generally random access memories (DRAMs) and more specifically to multilevel DRAMs, which store more than one bit per cell. This application is a continuation of PCT/CA00/00613 filed May 26, 2000 and claims priority from Canadian Patent Application No. 2,273,122, filed May 26, 1999.

BACKGROUND OF THE INVENTION

Many techniques are used to increase the storage density of dynamic random access memory (DRAM). These include reducing physical cell size and the use of complex three. dimensional cell capacitors structures. These techniques are becoming increasingly more expensive. One additional dimension that has yet to be successfully exploited in commercial RAM is to store more than one bit per cell. In a DRAM cell, this technique involves storing and then subsequently sensing two or more distinct voltage levels on a cell capacitor, and is referred to as a multilevel DRAM (MLDRAM).

Referring to FIGS. 1(a) and 1(b), an illustrative example is given of how four logic pairs of two bits, 00, 01, 10, and 11 may be represented as four equally spaced voltage levels in the range $V_{SS}=0$ to $V_{dd}$, that is $V_{SS}$, $\frac{1}{3} V_{dd}$, $\frac{2}{3} V_{dd}$, and $V_{dd}$. In order to extract the two bits from a cell, the cell voltage must be compared to at least two of the reference levels. The most significant bit (MSB) can be determine by comparing the cell voltage with the MSB reference of $V_{dd}/2$. If the cell voltage is greater than $V_{dd}/2$, the result of the comparison yields a logical one. A second comparison is then made to determine the least significant bit (LSB). The second comparison is made with a reference level of $5V_{dd}/6$. The result of this comparison will yield a logical one if the cell voltage is greater than $5V_{dd}/6$, and will yield a logical zero otherwise.

If the result of the MSB comparison was a logical 0 (that is the cell voltage is less than ½ $V_{dd}/2$) then the second comparison is made with a LSB reference level of $V_{dd}/6$. This comparison will yield a logical 1 if the cell voltage is greater than $V_{dd}/6$ and a logical 0 otherwise.

Several different MLDRAM schemes have been proposed thusfar. These schemes differ in the techniques to store analog cell voltages as well as the techniques used to sense and restore the cell signals. The sensing and restoring techniques for conventional two level DRAMs are well known and do not vary much between designs. However, for implementing MLDRAM, the sense and restore scheme is a difficult circuit to design. The multilevel sense and restore scheme must provide the capability to extract data encoded as one of many allowed voltage ranges on a capacitor, which is referred to as the sense operation. The scheme must also provide the capability to take multiple bits of input and convert them to one of many nominal voltage levels, which is referred to as the restore operation.

There are several important parameters that should be taken into account when assessing the quality of various sensing schemes. The size of the circuitry is important in that is must at least fit in the width of one or two columns of memory cells. Further, it is desirable that the sensing scheme is insensitive to process variation. In charge sharing operations used in MLDRAM, the capacitances involved depend on many process parameters, each of which has a different impact on the cell and bit line capacitance. Further, it is preferable that the sensing scheme is insensitive to noise. DRAMs are electrically balanced so that the common mode noise rejection in the sense amplifiers is very high. This requirement is even more important for MLDRAM, since the noise margins are considerably decreased as compared with DRAMs. Finally, it is preferable that the speed of the sensing scheme is comparable to that of the speed for a DRAM.

One multilevel sense and restore method is proposed by T. Furuyama et al. ("Furuyama") in an article titled "An Experimental Two Bit/Cell Storage DRAM for Macro Cell or Memory on Logic Application", IEEE J. Solid State Circuits, volume 24, number 2, pages 388 to 393, April 1989 and incorporated herein by reference. In this scheme, four voltage levels are mapped to two bits, as shown in FIG. 1(b). In order to read multilevel data, a cell charge is shared with a bit line. The bit line itself is modified such that it can be split into three equal parts called sub-bit lines, as shown in FIGS. 2(a), (b) and (c). Once the cell signal charge has been shared equally across the sub-bit lines, they are isolated from one another via switches controlled by signal SWT, and a sense amplifier SA is connected to each sub bit line via a switch controlled by signal CNCT. The multilevel data is compared in parallel to three reference voltages, as shown in FIG. 1(b), diluted by the ratio of the cell capacitance to the bit-line capacitance. A data bus carries the three sense amplifier outputs to a buffer, after which the three logic values are converted into two bits according to the function shown below in Table 1. For Table 1, the sense amplifiers compare the cell charge with $\frac{5}{6} V_{dd}$, $\frac{1}{2} V_{dd}$, and $\frac{1}{6} V_{dd}$ respectively.

TABLE 1

Conversion Function

| Sense Amplifier Results | Two Bit Data Value |
| --- | --- |
| 000 | 00 |
| 001 | 01 |
| 011 | 10 |
| 111 | 11 |

Restoring the data involves simply disconnecting the sense amplifiers SA from the three sub-bitlines and then reconnecting the sub-bitlines together. Charge sharing will give a final voltage on the bit lines equal to an appropriate value ($V_{dd}$, $2V_{dd}/3$, $V_{dd}/3$, or $V_{ss}$). A word line is asserted, thus capturing the desired multilevel voltage in an addressed cell.

The advantages of the present scheme are that it is fast and relatively simple. Using three sense amplifiers results in two bits being available at the same time. However, this scheme also results in more area being devoted to supporting circuitry rather than to storage cells, reducing the potential density gain that MLDRAM offers. A further disadvantage of this particular scheme is its susceptibility to sensing errors from improper reference values. The potential for such errors arises from the use of global reference voltages which need to be generated on a chip and distributed across the array of sub-bit lines. Even a slight inaccuracy in the global reference voltage levels is sufficient to introduce errors into the present scheme.

Another MLDRAM scheme is proposed by P. Gillingham in a paper title "A Sense and Restore Technique for Multilevel DRAM", IEEE Trans. on Circuits and Systems II: Analog and Digital Signal Processing, volume 43, number 7, July 19969" ("Gillingham"). The proposed scheme uses the same restore technique as the Furuyama scheme, but uses a different sensing method. The architecture of cell columns implemented uses two pairs of sub-bitlines, with each pair having a sense amplifier SAL, SAR as illustrated in FIGS. 3(a) and 3(c). The four sub-bitlines can be connected in six different ways using a transistor switch matrix as shown in FIG. 3(b). Also, each sense amplifier SAL, SAR can be disconnected from its respective sub-bitline pair through yet another set of switches controlled by signal CNCTL and CNCTR. Unlike the parallel operation of the sense amplifier used in the Furuyama scheme, the Gillingham scheme uses sequential sensing.

In sequential sensing, the result of the first sense amplifiers sensing operation is used to generate the reference voltage for the second sensing operation. An initial sensing operation compares the multi-level data to VDD /2 and the reference for the final sensing operation is generated. If the first sensing operation reveals that the cell voltage is above VDD /2 then the second sensing operation will compare (after dilution) the cell voltage to an LSB reference of 5VDD /6. Conversely, if the first sensing operation reveals that the cell voltage is below VDD /2 then VDD/6 is chosen as the LSB reference. The results of the two sensing operations produce the MSB and LSB values for the one addressed cell. At this point the data is latched at the sense amplifiers and ready for reading.

The advantage of this circuit is that it uses local components for sensing and storing operations. Therefore, the reference signal is created using the cell which is being read rather than a special reference cell as in the Furuyama scheme, thereby removing the potential for errors arising from the use of global reference voltages. However, there is a significant time penalty incurred for sequential sensing. There are also further operations that require charging of the bitlines between sensing and restoring that adds to the cycle time. A further drawback of the present system is the complexity of the control logic required. Furthermore, the present sensing scheme may also not fit easily into the bitline pitch of a DRAM process since it requires the sense amplifiers to fit into the pitch of one cell column.

A third scheme is described by T. Okuda et al. is described in a paper titled "A Four Level Storage for—Gb DRAM," IEEE J. Solid State Circuits, Volume 32, No. 11 pages 1743 to 1747, November 1997. As in the Gillingham implementation, the reference levels are developed using sequential sensing. However, rather than using local charge sharing to generate the LSB reference voltages, a capacitive coupling method is used. The value of the most significant bit is placed onto a capacitor which bumps a second reference value up or down from the middle reference to one or the two possible LSB references. The advantage of the present scheme is its simplicity. The extra circuitry is needed is minimal and the control timing is relatively simple. However, the most vulnerable aspect of this design is the use of the coupling capacitors to produce the LSB reference. These capacitors must be exactly proportioned to the cell capacitance since any error in the ratio translates directly into a reduction in the noise margins.

Therefore, it is desirable to provide a scheme that provides the fast access advantage of the Furuyama implementation with the idea of local reference generation provided by Gillingham. Accordingly there is a need for a memory architecture which mitigates at least some of the above disadvantages.

SUMMARY OF THE INVENTION

In accordance with this invention there is provided a dynamic random access memory for storing one of N levels in each of a plurality of memory cells, the memory cells having storage capacitors coupled to bitline pairs through switches for writing and reading data to and from the memory cells, the memory comprising:

(a) at least N−1 bitline pairs, each bitline pair being divided into N−1 sub-bitlines by first switches therebetween; the sub-bitline pairs of each bitline being coupled to adjacent sub-bitline pairs by second switches therebetween, to form N−1 groups of sub-bitlines each for producing one of N−1 reference voltages;

(b) sense amplifiers coupled to each sub-bitline pair;

(c) N−1 sub-bitline pairs each having reference cells for selective coupling thereto;

(d) (N−2)(N−1) sub-bitline pairs each having generate cells for selective coupling thereto; and (e) sub-bitline pairs being selectively connected in a group through switches such that:
  the sub-bitlines in said group are precharged to one of a plurality of voltages;
  one of said (N−1) reference voltages is generated by shorting together sub-bitlines in said group; and
  the reference voltage is stored in a reference cell in one of said bit-line pairs in said group.

BRIEF DESCRIPTION OF THE DRAWINGS

The present invention will be described by way of example only with reference to the following drawings in which.

DESCRIPTION OF THE PREFERRED EMBODIMENTS

Figure 5A:
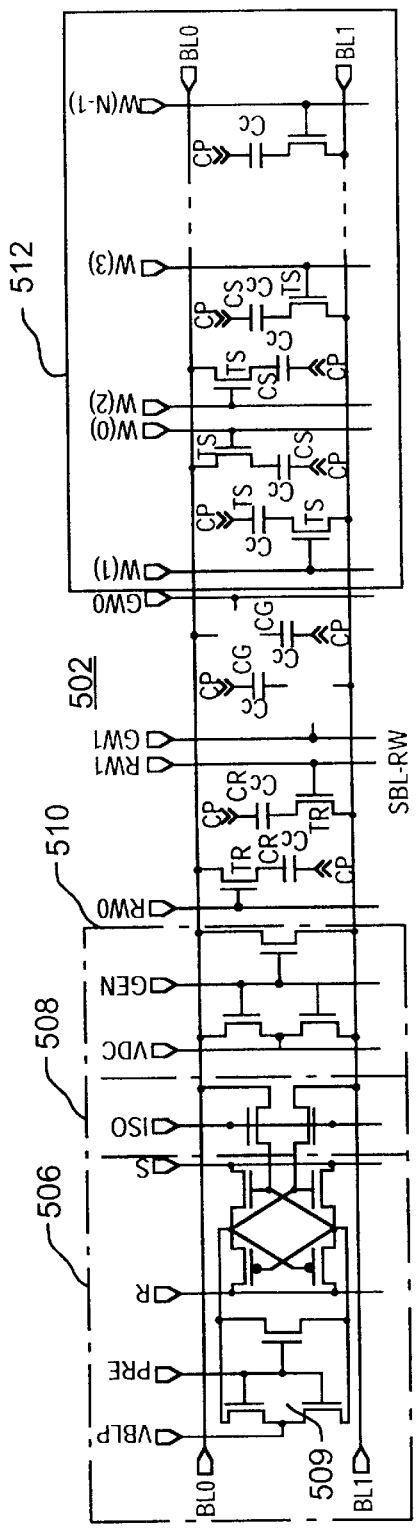
FIGS. 5(a) and (b) is a schematic diagram of sub-bitline pairs according to an embodiment of the present invention.
Figure 5B:
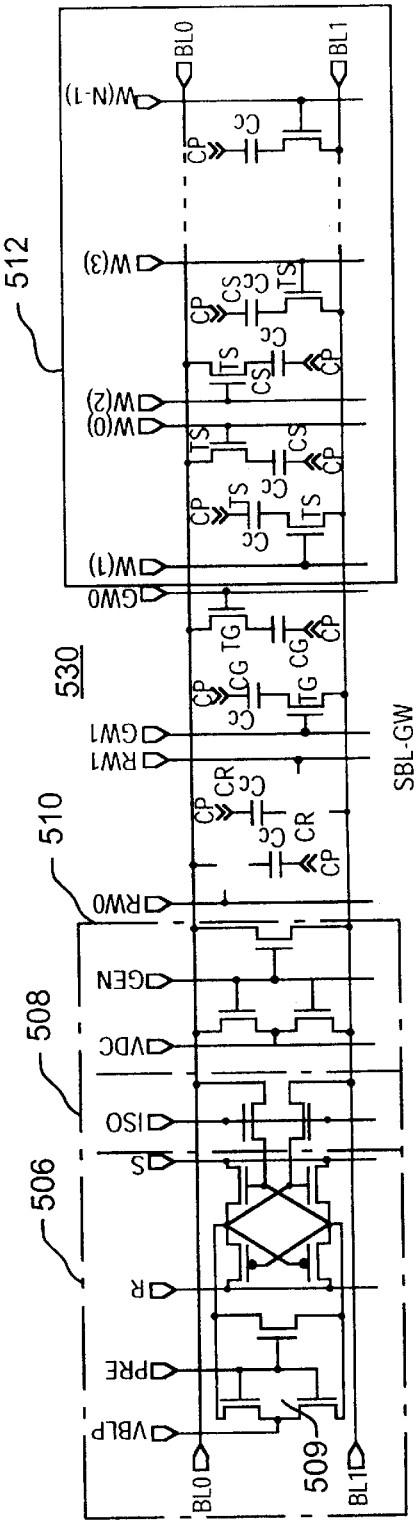
Figure 6A:
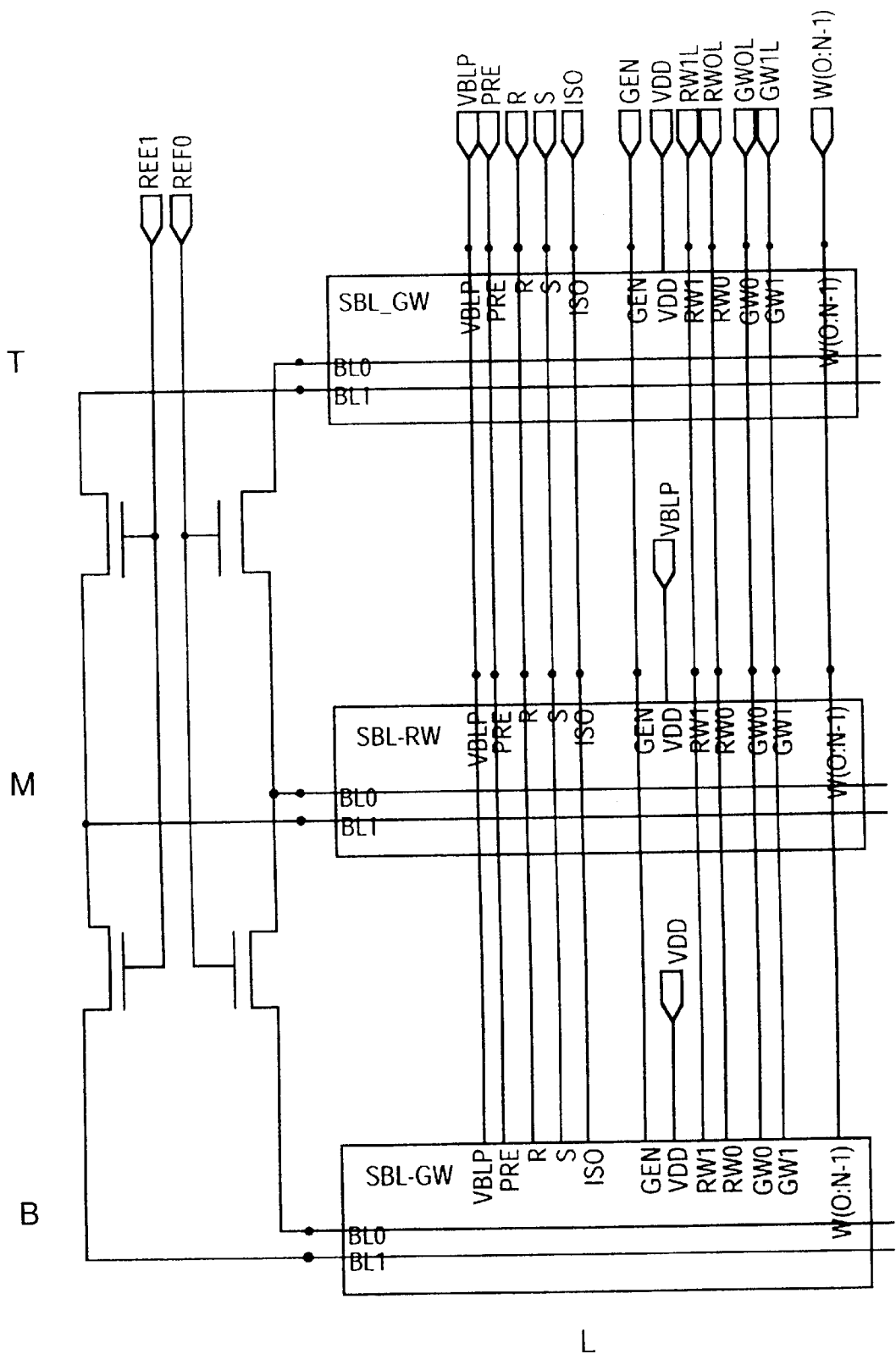
FIG. 6 is a schematic diagram of an MLDRAM scheme according to an embodiment of the present invention.
Figure 6B:
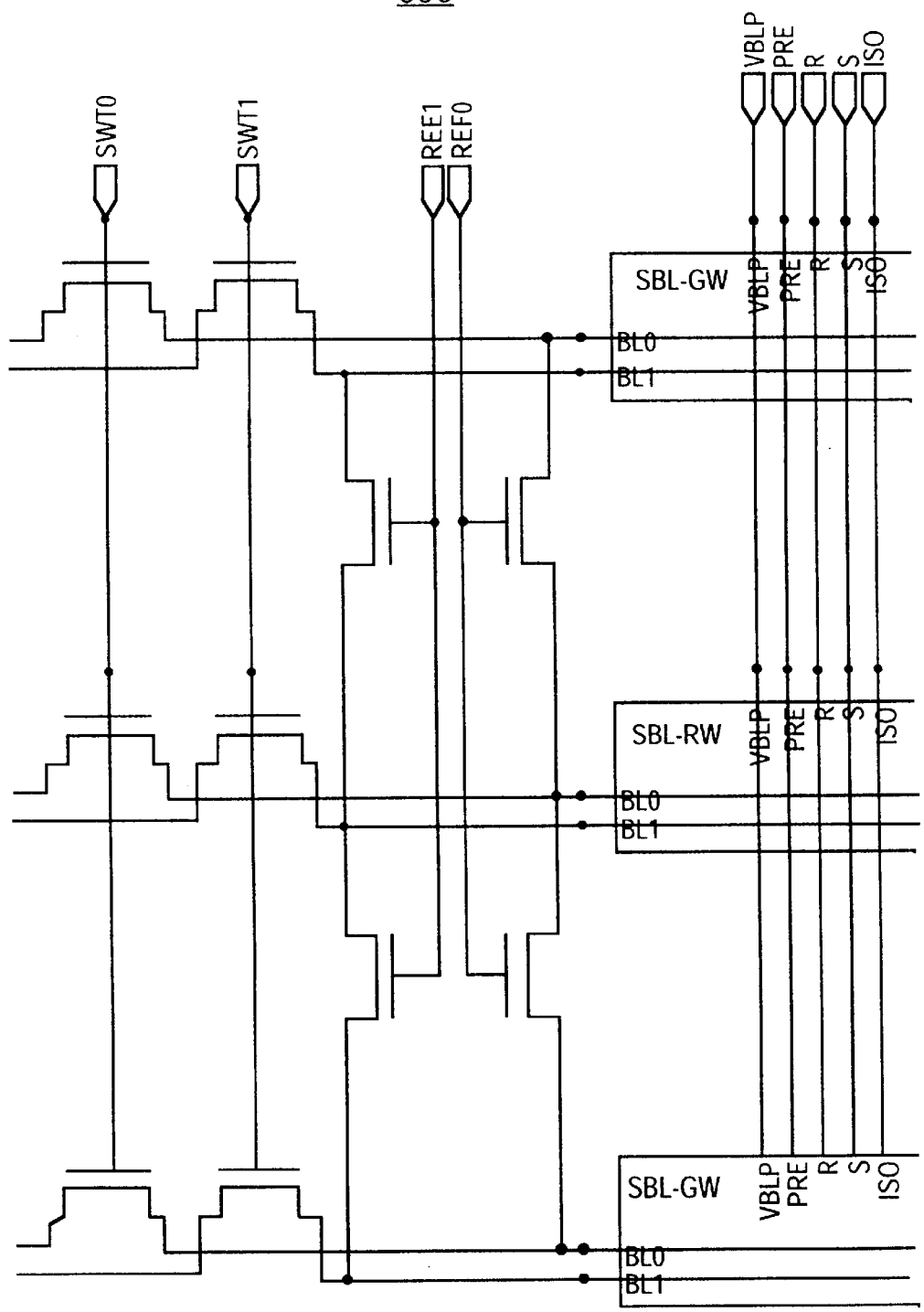
Figure 6C:
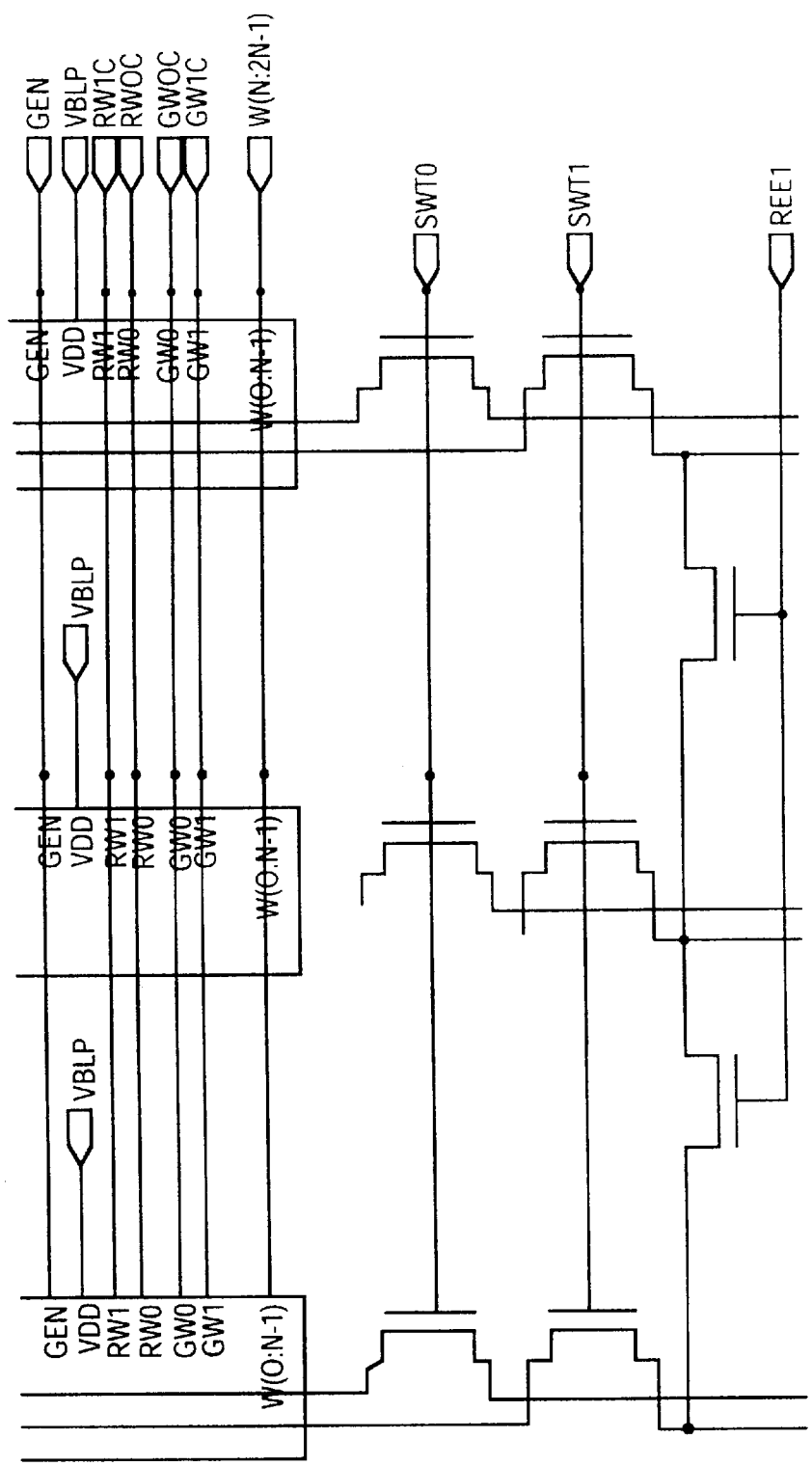
Figure 6D:
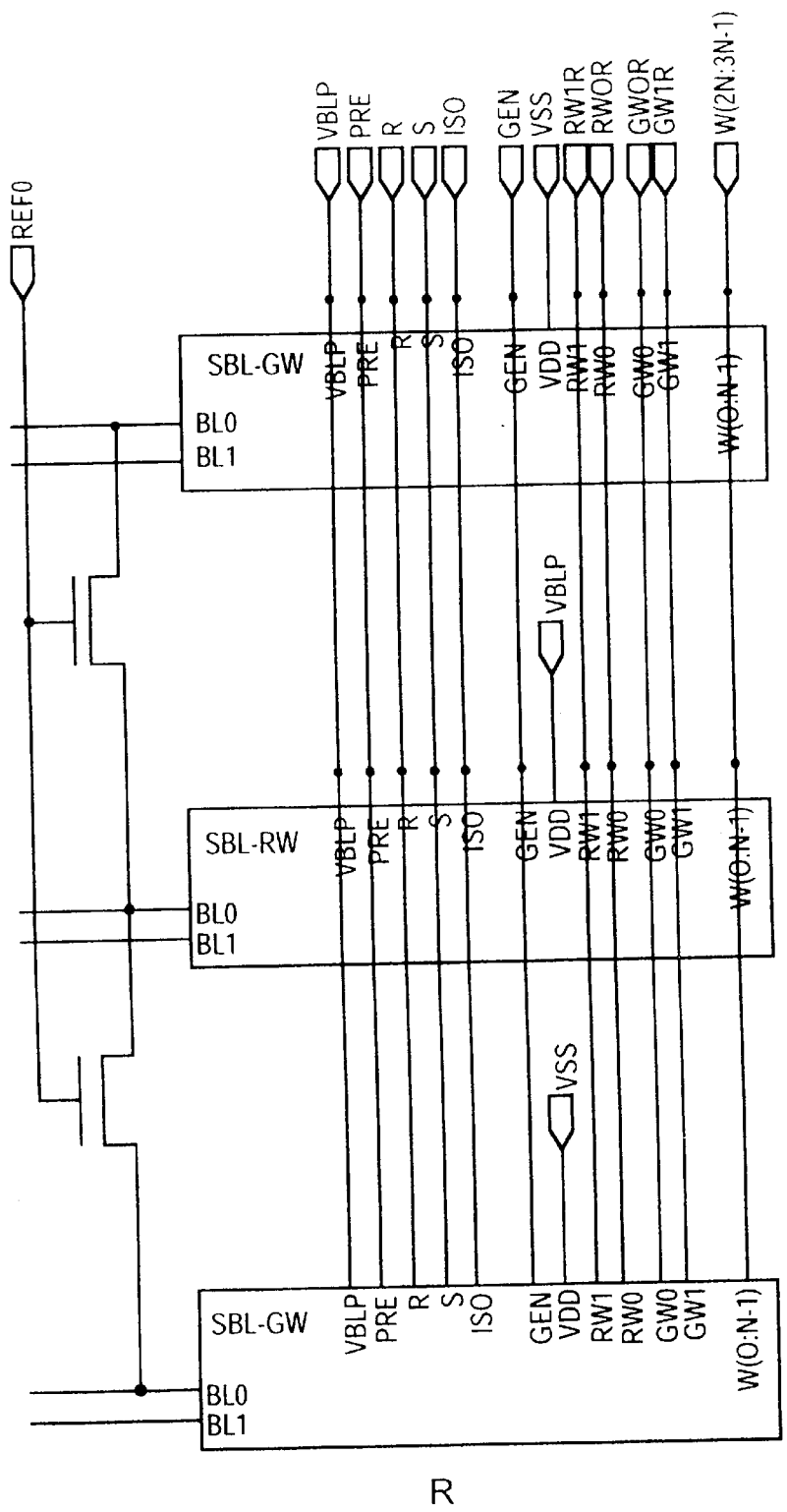

In the following description like numerals refer to like structures in the drawings. Referring to FIGS. 5(a) and 5(b), a basic reference sub-bitline pair SBL-RW and generate sub-bitline pair SBL-GW each having even and odd bitlines BL0, BL1 are indicated generally by the numeral 502 and 530 respectively. Each sub-bitline pair SBL-RW, SBL-GW includes a sense amplifier 506, its associated precharge devices 509 controlled by precharge signal PRE, sense amplifier isolation devices 508 controlled by isolation signals ISO and M wordlines W(0) to W(M−1). Although not shown, the sense amplifiers have a typical data bus connection.

Each sub-bitline pair SBL-RW, SBL-GW also includes a bitline precharging circuit 510 for shorting the bitlines BL0, BL1 to a voltage applied to terminal VDC of the precharge circuit 510 in response to a generate signal GEN. In addition to the M normal wordlines 512, the sub-bitlines SBL-RW, SBL-GW include four additional dedicated wordlines RW0, RW1, GW0 and GW1. In the following description, the wordline signals RW0 and RW1 will be referred to collectively as "reference word lines", and the wordline signals GW0 and GW1 will be referred to collectively as "generate wordlines".

Each of the M normal word lines W(i) is coupled to a storage capacitor CS via an access transistor TS. Both the SBL-RW and SBL-GW sub-bitlines include reference capacitors CR and generate capacitors CG.

For the SBL-RW sub-bitline, the reference wordlines RW are coupled to respective reference cell capacitors CR via reference access transistors TR. The reference capacitors are used for storing the generated reference voltage, as will be described later. However, the generate wordlines GW are not coupled to generate capacitors CG. On the other hand, For the SBL-GW sub-bitline, the generate wordlines GW are coupled to respective generate cell capacitors CG via generate access transistors TG. However, the reference wordlines RW are not coupled to reference capacitors CR.

Thus it may be seen that the only difference between the SBL-RW and SBL-GW sub-bitlines is that there are no cell access transistors on the generate wordlines of the SBL-RW and in the SBL-GW there are no cell access transistors on the reference wordlines. Although it is possible to remove the cell capacitors in both cases, it is desirable that disturbance to the regularity of the array is minimized in order to achieve a high reliability in manufacturing. Two possible options for effectively omitting the transistors are to omit either a portion of the thin oxide (diffusion region) and to omit a bitline contact where necessary. These and other methods are well known in the art of manufacturing and will not be described in further detail.

Referring to FIG. 6, there is shown a schematic diagram of an MLDRAM architecture 600 according to one embodiment of the present invention for a four level, 2-bit memory device using the sub-bitline blocks as described above. With this architecture it is possible to combine the fast access advantage of Furuyama with the local reference generation of Gillingham. In the subject embodiment of the invention, each bitline pair is divided into three equal-length sub-bitline pair segments, where each segment is provided with a sense-amplifier circuit for allowing fast, single-step flash-conversion sensing. The new scheme uses charge-sharing techniques between three adjacent sub-bitlines to locally generate the three reference levels, instead of using globally generated reference voltages for sensing.

Accordingly, as shown in FIG. 6, the two basic sub bitline pairs SBL-RW and SBL-GW are arranged in a 3-by-3 array. The rows of the array are identified by the symbols T (top), M (middle), B (bottom), and the columns by the symbols L (left), C (centre), R (right). The position of each sub bit line pair is identified by a horizontal coordinate (L, C, R) and a vertical coordinate (T, M, B). Using such a co-ordinate system, the sub-bitline pair in the top row and the right column, for example, is said to have coordinate TR. The sub-bitlines can be connected together horizontally in groups, that is L to C to R, via first switches controlled by signals SWT0 and SWT1. Further, the sub bit lines can be connected vertically, that is T to M to B, via second switches controlled by signals REF0 and REF1.

The middle row M of sub-bitline pairs comprises the SBL-RW sub-bitline pairs, while the top and bottom rows comprise the SBL-GW sub-bitline pairs. Each of the sub-bitline pairs also differs in the voltage supply coupled to the VDC terminal. They are as follows: TL and BL have VDC connected to VDD (power supply voltage), TR and BR have VDC connected to $V_{SS}$(ground) and the others are connected to VDD/2 referred to as VBLP. Thus as may be seen in FIGS. 5(a) and (b) the generate signal GEN connects the sub-bitlines to the appropriate VDC voltage. More specifically the GEN signal is used to generate the reference voltages after a restore in preparation for the next sensing cycle. The sub-bitline connection switches SWT0 and SWT1 and reference switches REF0 and REF1 have a regular arrangement and provides connection between sub-bitlines in both horizontal and vertical directions.

The above architecture is merely exemplary and once the operation of the circuit is described, it will be appreciated that there are other possible variations of this arrangement.

Figure 1:
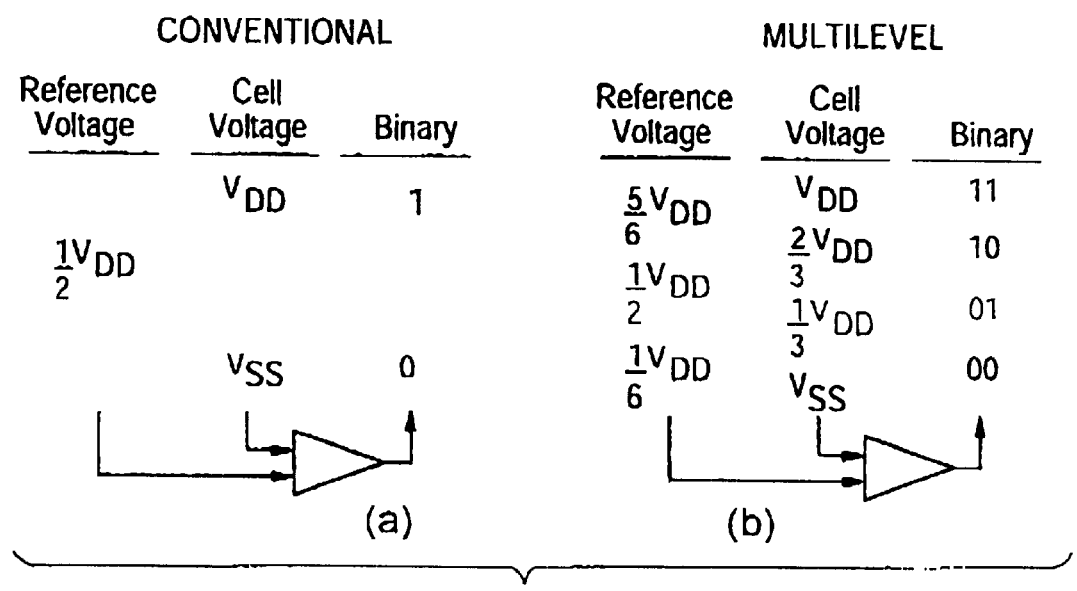
FIGS. 1(a) and (b) are schematic diagrams illustrating, the storage and reference voltages of a conventional one-bit storage scheme and a two-bit storage scheme (prior art)
Figure 2A:
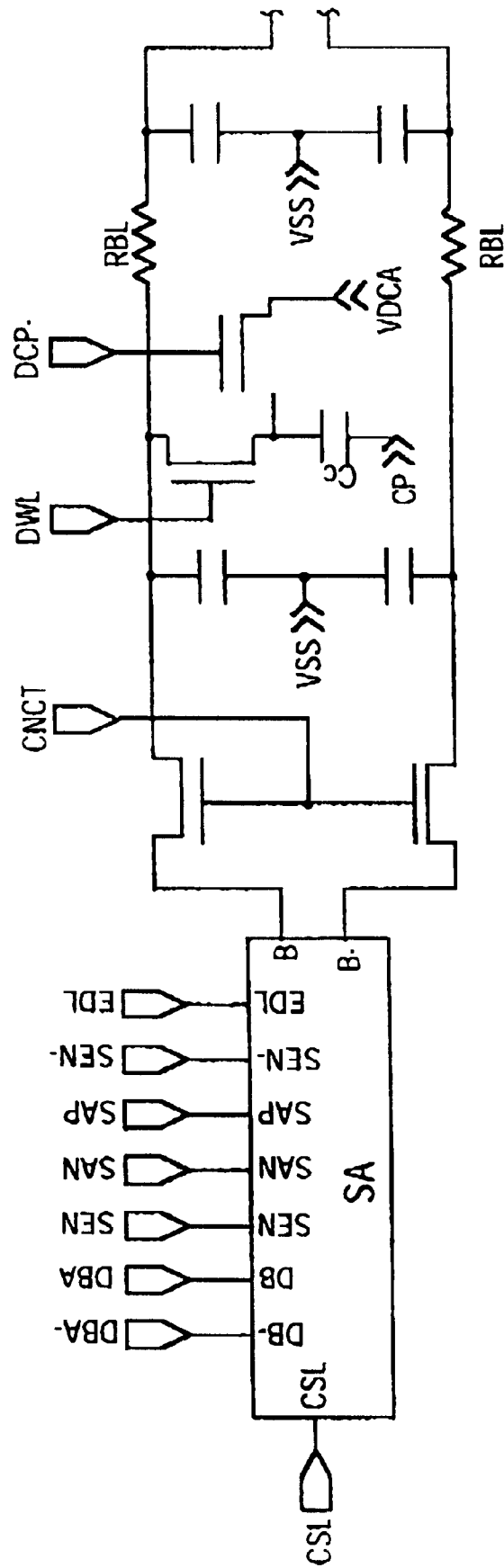
FIGS. 2(a), (b) and (c) is a schematic diagram illustrating (b$^1$) an MLDRAM implementation according to the prior art.
Figure 2A:
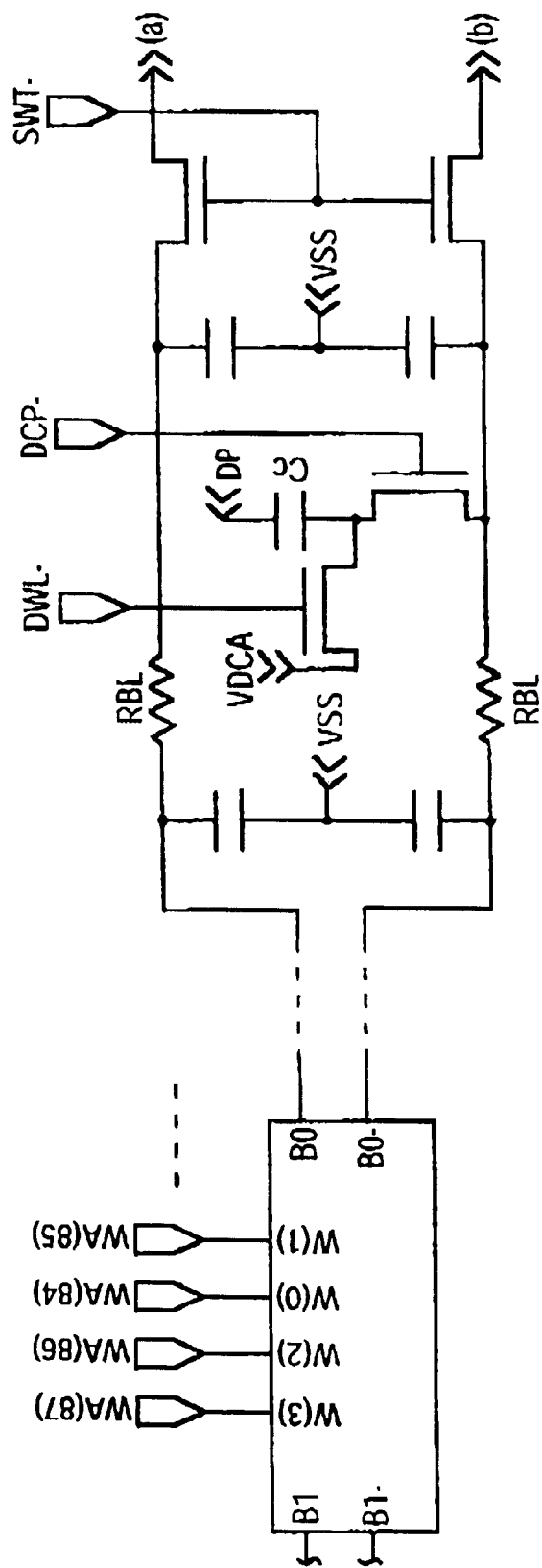
Figure 2B:
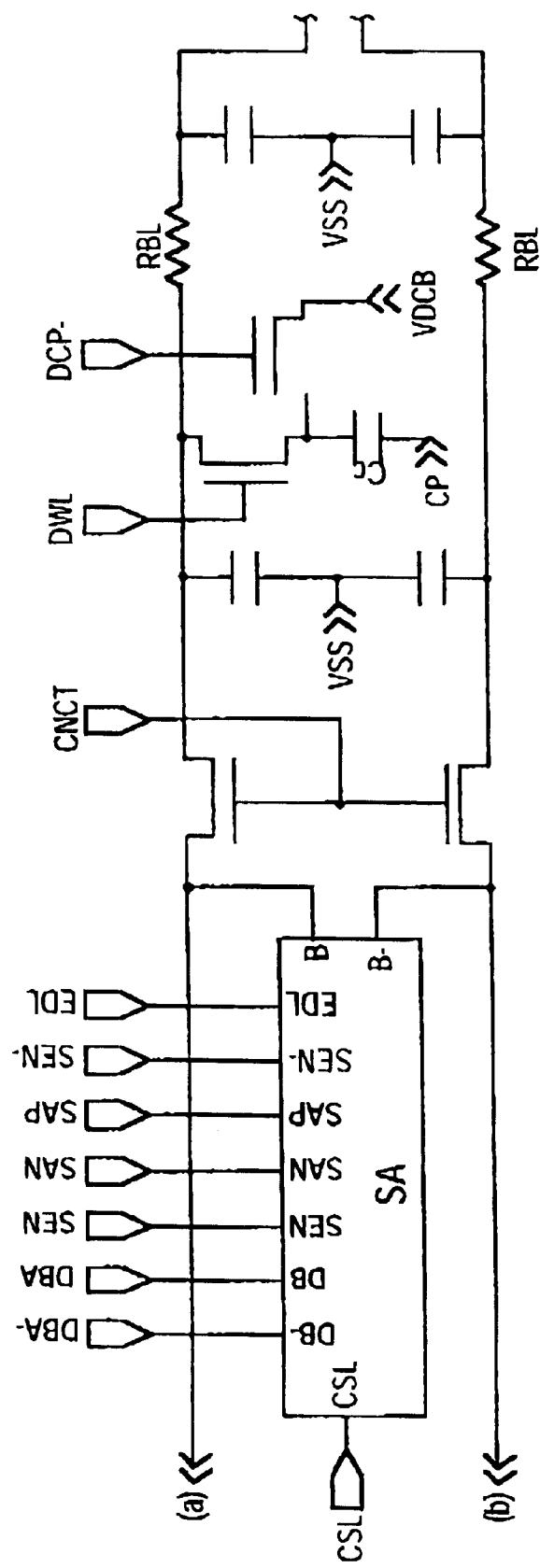
Figure 2B:
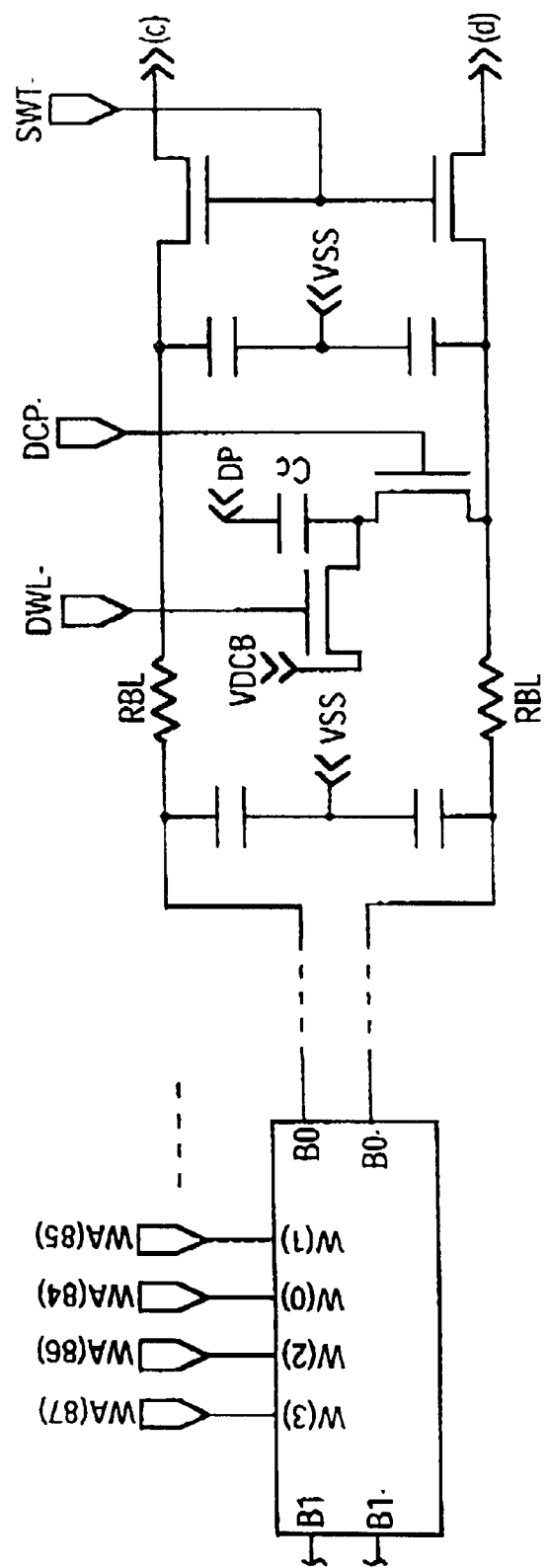
Figure 2C:
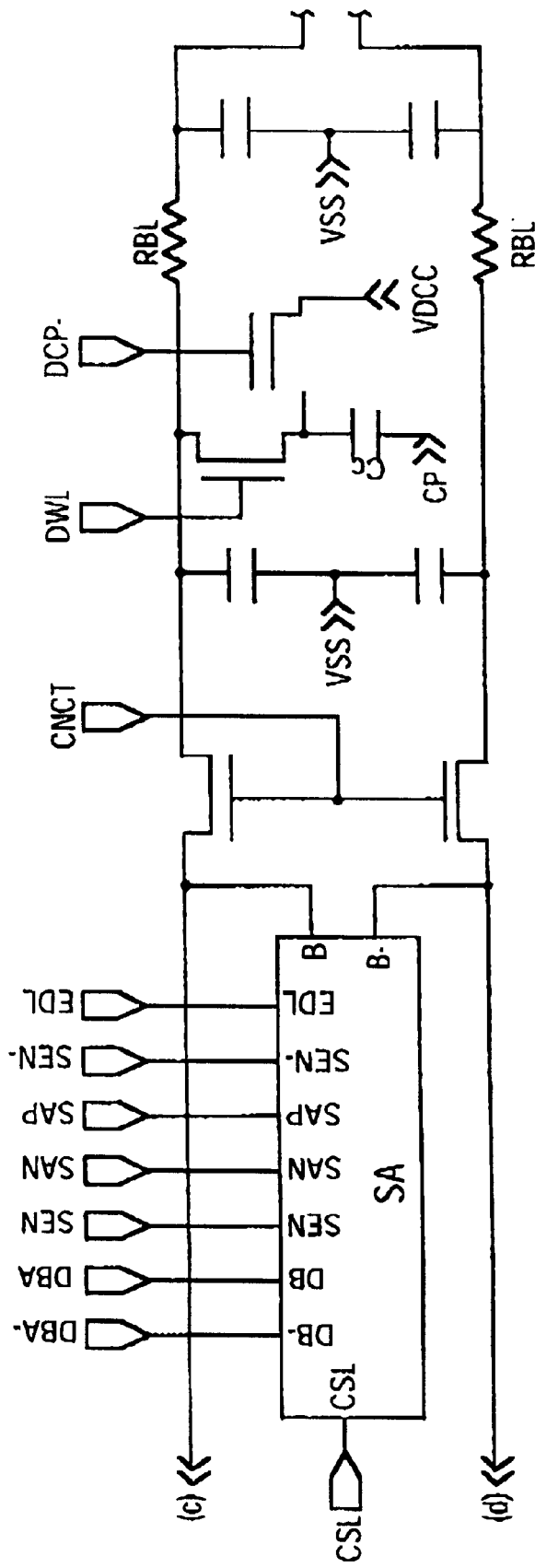
Figure 2C:
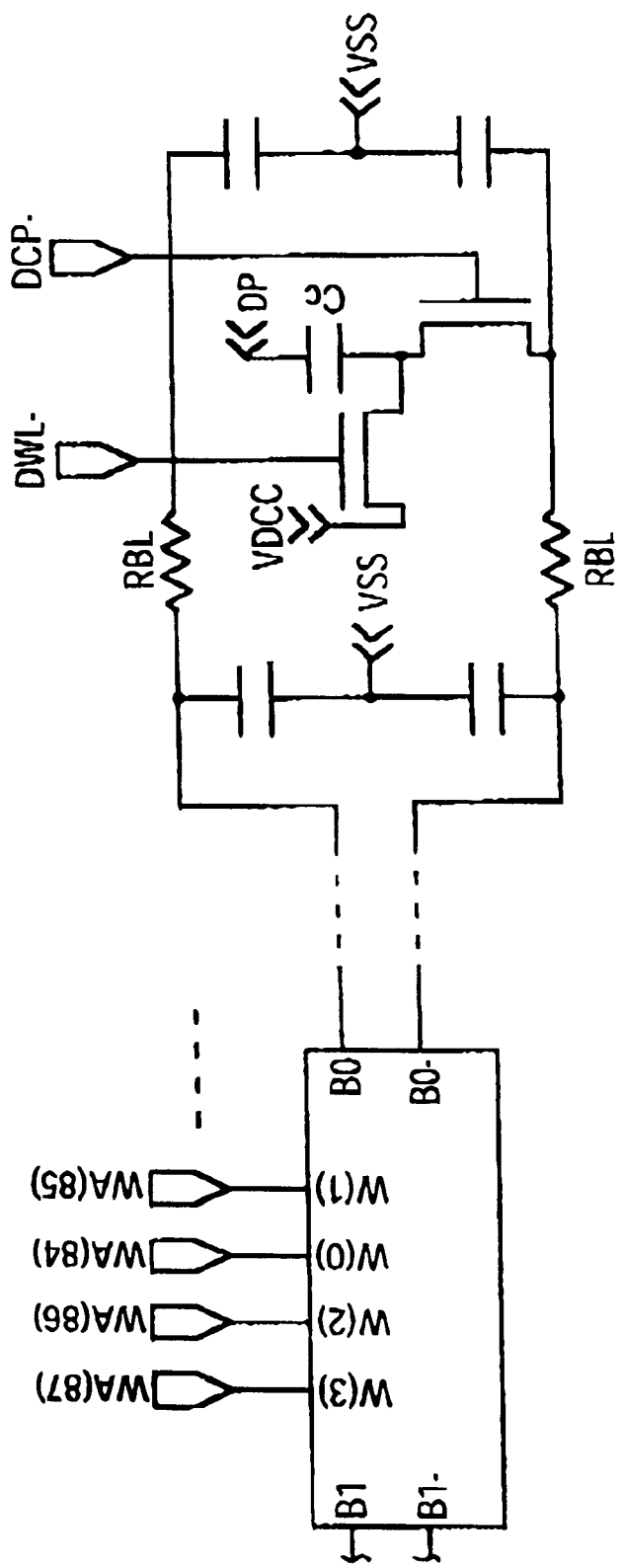
Figure 3A:
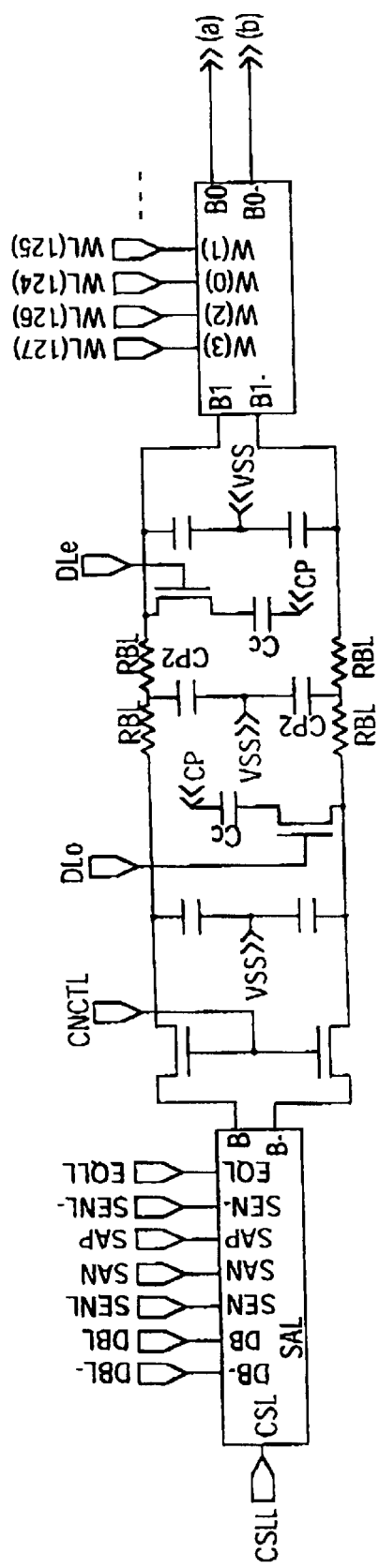
FIGS. 3(a), (b) and (c) is a schematic diagram illustrating a further MLDRAM implementation according to the prior art.
Figure 3B:
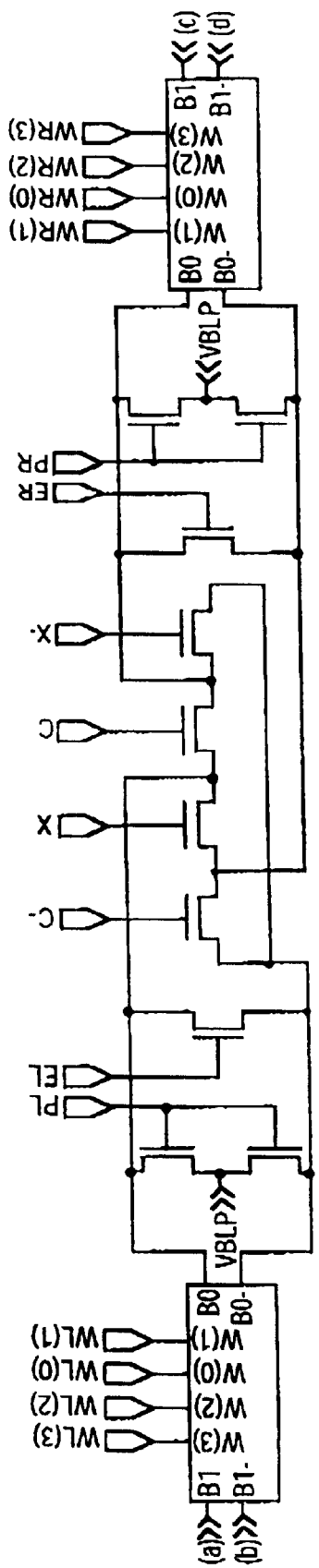
Figure 3C:
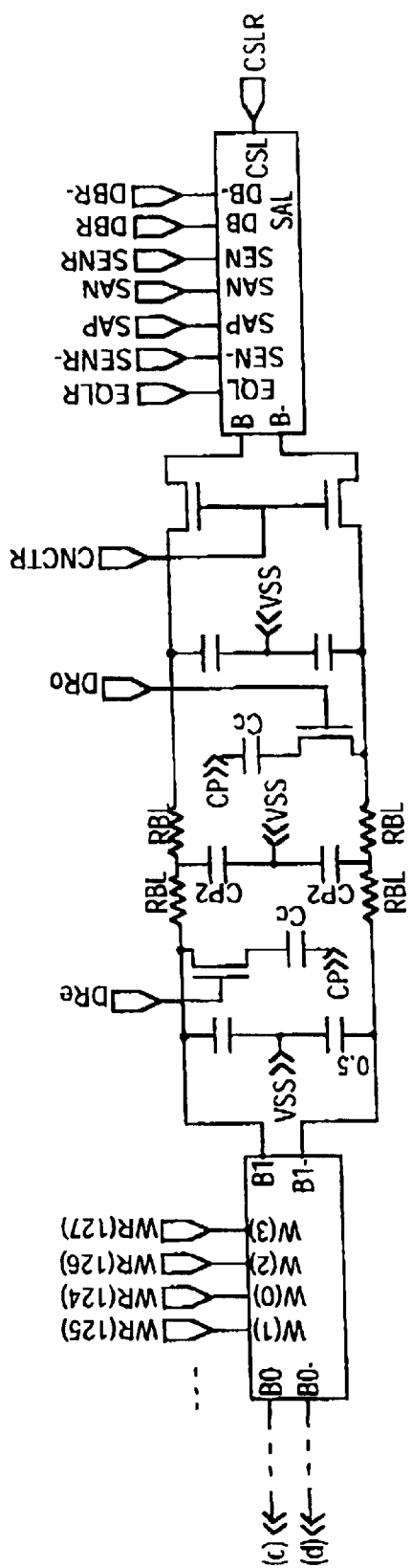
Figure 4A:
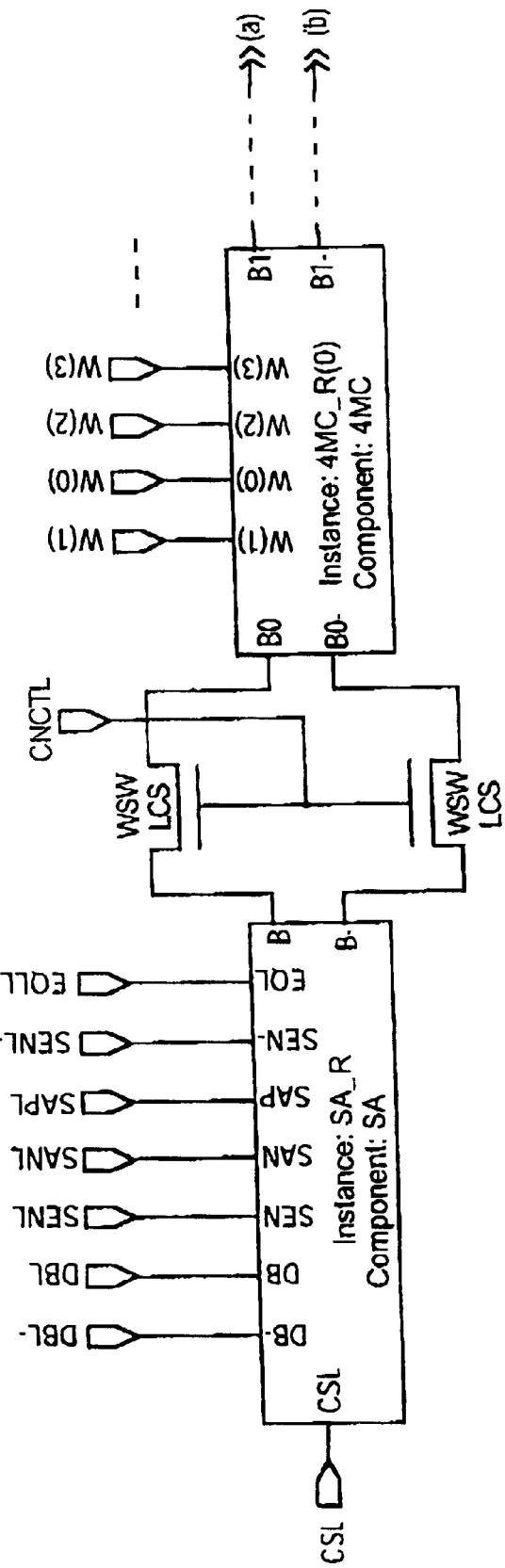
FIGS. 4(a), (b) and (c) is a schematic diagram illustrating a further MLDRAM implementation according to the prior art.
Figure 4B:
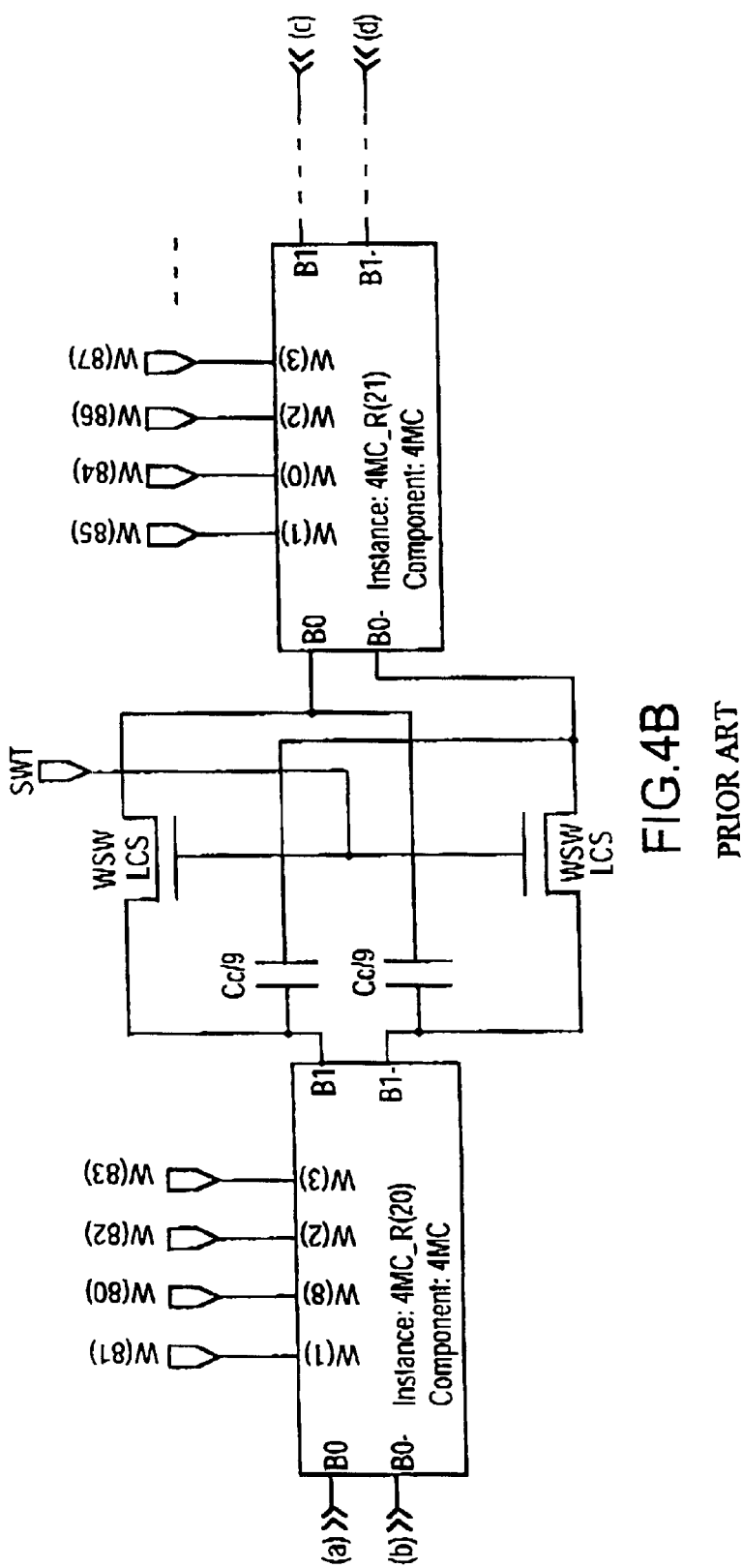
Figure 4C:
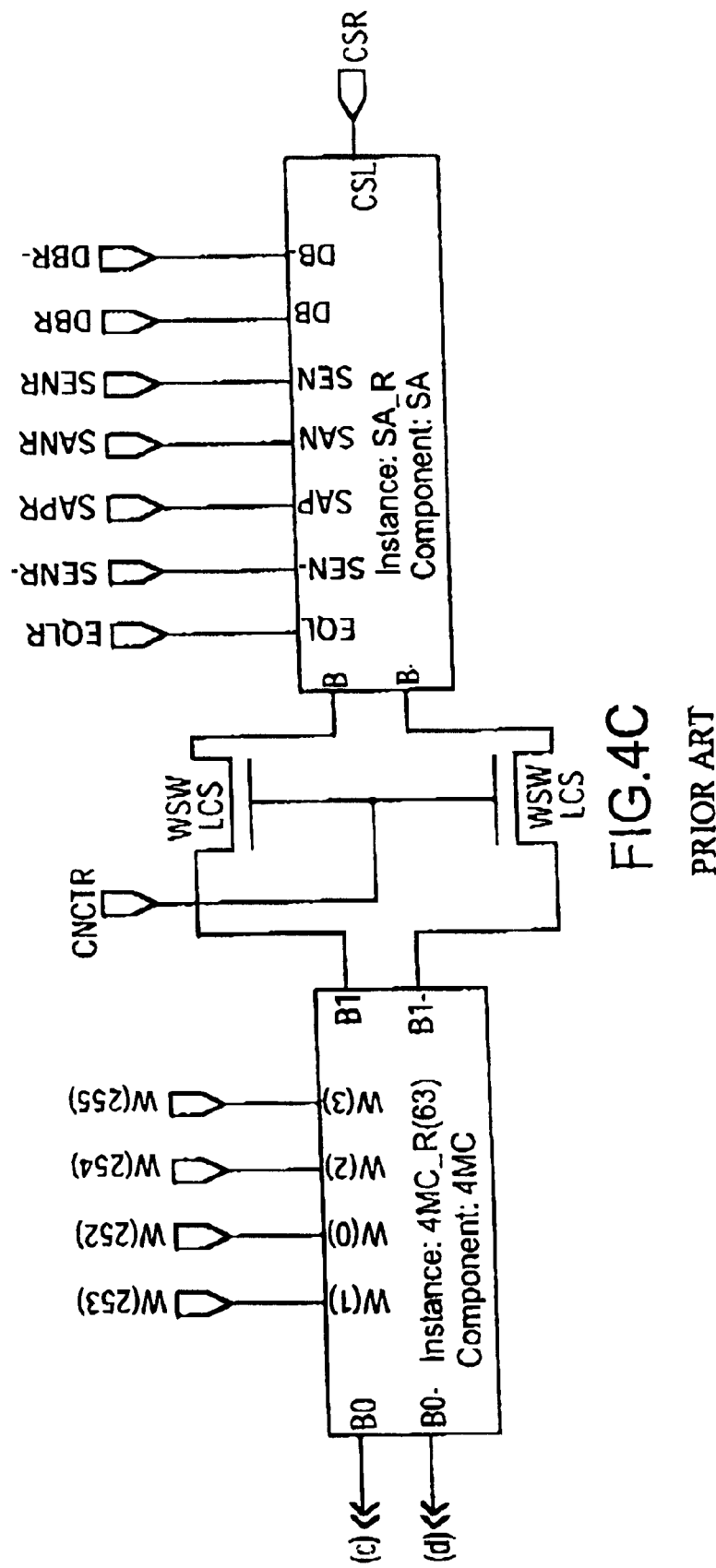

Firstly, the charge sharing technique for generating the local reference voltages, the values of which are shown in FIG. 1 (b), will be described. Then the sense-restore cycle will be described.

The middle row M consists of SBL-RW sub-bitlines, thus reference cells are provided in the ML, MC and MR sub-bitline pairs. Consider ML first. Sub-bitlines in TL, ML, and BL are precharged separately to $V_{SS}$, V BLP, and V SS, respectively, by asserting the GEN signal. To ensure that the capacitances of all sub-bitlines are equal, the RW0, RW1, GW0 and GW1 signals are all asserted causing each sub-bitline to have the same capacitance equal to the parasitic capacitance of the bitline (Cb) plus one memory cell (Cc). After charging, the sub-bitlines are shorted together (T to M to B) creating the final voltage of VDD /6. The same operation is performed on the C and R groups of sub-bit lines but the charged values for these cause the resulting voltage to be VDD/2 for TC, MC, and BC and 5VDD/6 for TR, MR, and BR. Having created the three required reference voltages, the reference voltages are stored in the reference cells CR by deasserting signals RW0 and RW1 in L, C, and R.

Thus from the from the VDC values the exact reference level is created through charge sharing and shortly thereafter it is captured in the reference cells by de-asserting all reference wordlines. Through this novel method of charge sharing the reference voltages are accurately created.

Figure 7:
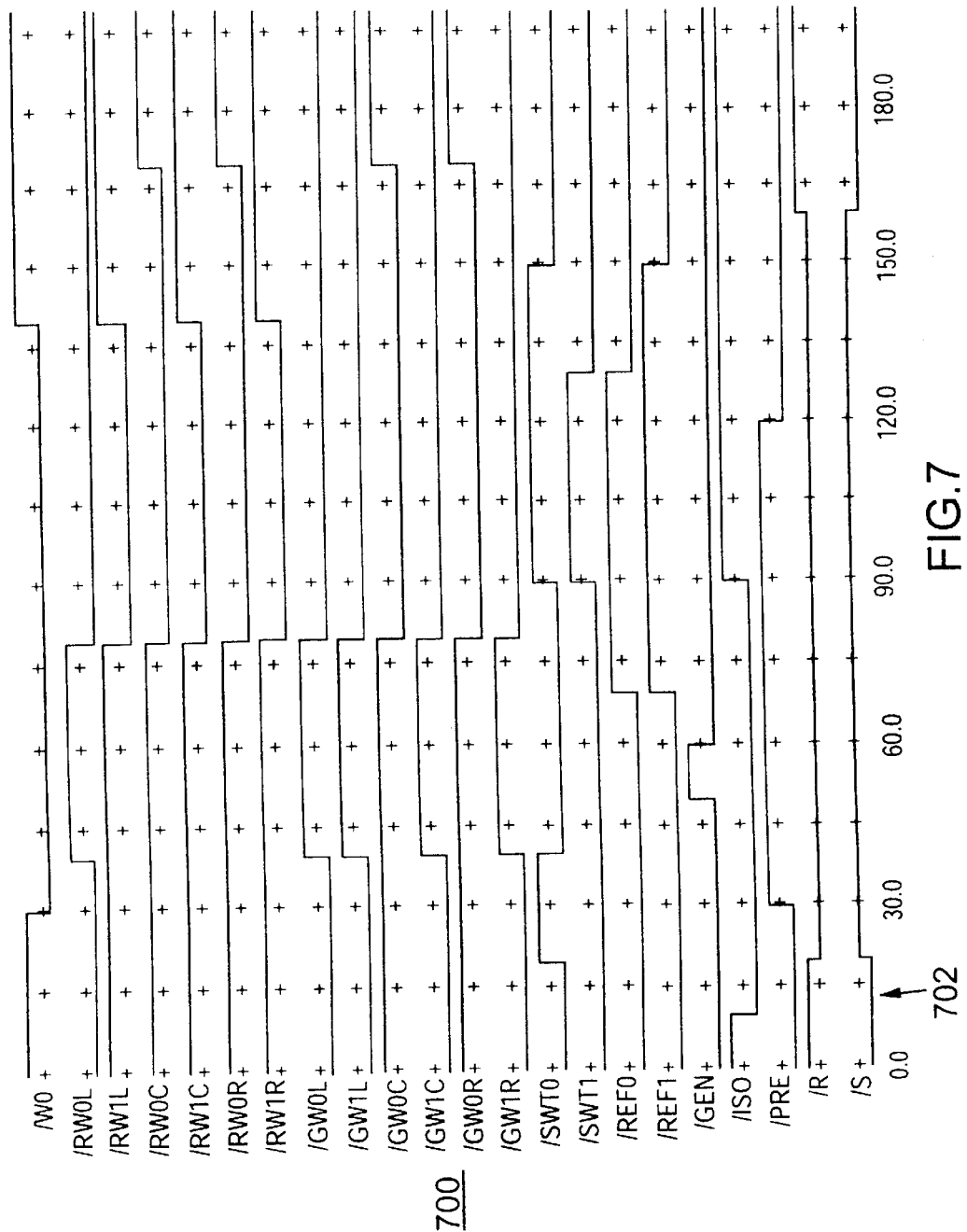
FIG. 7 is a timing diagram for the circuit of FIG. 6.

Referring to FIG. 7, the control timing for the device 600 is shown. The control timing shown is most easily understood by considering the initial conditions when the sense amplifiers are turned on and the wordline is asserted. The control timing shows first the multilevel restore, then the reference voltage generation and finally the access (read). In normal operation the starting state of the cycle is the store state when the sense amplifiers are off, the wordlines are all off and all of the sub-bitlines are precharged to VBLP.

To explain the operation, assume that W0 (wordline–0) has just been accessed and is awaiting restore. From FIG. 7 it can be seen that W0 falls in the left-hand (L) sub-bitlines. This is an important observation since as discussed earlier, the location of the wordline (L, C or R) determines the operation of the reference and generate signals used for restore. The circuit is designed such that, the initial starting state before a restore all sub-bitlines have equal capacitance. By design, the total node capacitance on the sub-bitlines is equal. This can be understood by looking at the control timing. In the initial state 702 the following signals are active: W0, RW1L, RW0C, RW1C, RW0R, RW1R, GW0C and GW0R. All inter-sub-bitline switches (SWT0, SWT1, REF0, REF1) are off and the sense amplifiers are on. The latched value on the sense amplifiers represents multilevel data in a three-bit "thermometer code" as there are three sense amplifiers per bitline. The coding is shown in Table 1. The four possible states of the three sense amplifiers are mapped to their associated binary value. The decoding/encoding may for example be performed as described in Furuyama, incorporated herein by reference.

The restore voltage is generated through charge sharing by shorting the three sub-bitlines together as one long bitline, in a manner as described in Furuyama. The resulting voltage will be exactly as expected. The reference and generate wordlines are used to completely balance out all sub-bitline capacitances and there is no shorting between parallel sub-bitlines. The restore problems of the prior art are thus avoided.

Referring to FIG. 7 again, the restore occurs first by asserting SWT0 to short the BL0 sub-bitlines together and then by de-activating the wordline W0 capturing the voltage in the memory cell. The restore is complete. Now the reference voltages must be generated and stored in the reference cells as described earlier. At the same time that the reference wordlines are deactivated the generate wordlines are deactivated. This is to prepare for precharge and the usual initial conditions of an access cycle.

The circuit returns to the inactive precharge state. As shown in FIG. 7, the SWT0 and SWT1 switches are turned on and the REF0 and REF1 switches are turned on. Conservation of charge ensures that the sub-bitlines (9 sub-bitline pairs) all tend to the precharge voltage, VDD/2. This easy precharging is unlike Gillingham where there is a serious precharging problem. In Gillingham the worst case is where all cells are restored to the 01 or 10 state. In that case the precharge voltage source, which is usually a limited-current on-chip source, is heavily loaded with the burden of bringing each and every bitline back to VBLP.

From this state, a random access may occur. Assume again that the cells along wordline W0 are accessed. Because it is an even wordline and so associated with the true bitline, the SWT1 switch is de-asserted leaving only the true bitlines connected through SWT0. At the same time, the REF0 switch is de-asserted while the complementary bitlines remain shorted. The reference wordlines RW1L, RW1C and RW1R and the wordline W0 are asserted together. The sense amplifiers thus compare the charge stored in the memory cell to the charge stored in the reference cells. There is no specification to the absolute value of the precharge voltage, only that it is near VDD/2. The comparison assumes that the sub-bitlines only have the same locally generated precharge voltage regardless of its absolute value. This is a significant advance from the prior art where the cell is compared to VBLP in which case the result is highly sensitive to the absolute value of VBLP.

The charge from the cell is diluted across three sub-bitlines and one cell through two switches. The reference cell signals are each shared from one cell to three sub-bitlines and one cell through two switches REFx. The total capacitive symmetry effectively cancels out previously ignored but important higher order effects. For example, charge injection is not a problem. Each and every signal has equal charge injection effecting it. The memory of the present invention is balanced to a higher order than previous designs. After the charge sharing is complete the remaining switches, REF1 and SWT0, are de-asserted leaving each sub-bitline totally isolated. The sense amplifiers are turned on and the data is recovered and latched. These simple steps ensure a low access time. One final operation is performed just after sensing. That is, in order to prepare for restore, the reference and generate wordlines that do not share the same sub-bitline as the wordline are asserted. In this case, RW0C, RW0R, GW0C and GW0R are asserted. This ensures that the restore operation will consist of exactly one sub-bitline and one cell capacitance per sense amplifier thus ensuring the exact capacitance matching needed for proper restore.

It may also be observed that in a further embodiment of the invention, either PMOS or NMOS pass transistors, or full complementary CMOS transmission gates, could be used for the devices controlled by the following signals: GEN, SWT0, SWT1, REF0, REF1, ISO.

Furthermore, it is possible to reduce the device count by combining the precharge devices in the sense amplifier with those devices used by the GEN signal. One option is to omit the ISO transistors and the precharge devices in the sense amplifiers altogether. To do this would require a change in the sense amplifier because it would need to be precharged to VDC during reference generation. Thus the nodes R and S must be left floating or shorted to VDC as well. This may introduce unwanted circuit complexity and may not save any area at all.

The final state of the circuit, as in the precharge (idle) state, currently specifies that REF0, REF1, SWT0 and SWT1 are left on. This could be changed so that these switches are off. This would change the first event of the "cycle" (as in access) but would accomplish the same task. It may be assumed that (a) turning a switch off is faster than turning it on (b) leaving all sub-bitlines connected together provides multiple paths to VBLP and thus reduces the chances of any kind of transient differential voltage appearing between sub-bitlines.

The architecture and the reference generation, sensing and restore method are applicable to MLDRAMs that store other than 4 levels per cell. The preceding disclosure describes the 2-bit case in detail where the number of levels (N) is 4. An MLDRAM with a different number of levels per cell would have the following characteristics:
Each cell would store $\log_2 N$ bits. This number of bits does not have to be an integer. The voltage interval between levels, as stored in the cell would be $VDD/(N-1)$. The reference voltages are $(1+2a)VDD/(2(N-1))$, $a=\{0, 1, \ldots (N-2)\}$. A group of bitline pairs contains $(N-1)$ bitline pairs. Each bitline pair contains $(N-1)$ sub-bitlines pairs. Hence the array would have $(N-1)$-by-$(N-1)$ sub-bitline pairs instead of the 3-by-3 organization shown in FIG. 6. Each group of $(N-1)$ sub-bitline pairs coupled by the REFx-controlled transistors produce one of the $(N-1)$ reference voltages.

The number of levels per cell does not have to be a power of 2. When multiple cells are taken together as a word, often more "whole" bits can be used. For example: a 3-level cell stores 1.58 bits so two 3-level cells store 3.17 bits; four 5-level cells store 9.29 bits; two 6-level cells store 5.17 bits. The extra bits, including fractional bits, could be used for error correction.

In FIG. 6, sub-bitline pairs can be rearranged without changing the function of the circuit. Columns can be permuted, as can rows.

Extra transistors controlled by REF0 and REF1 (see FIG. 6) could be added to also connect between 3-by-3 groups of sub-bitline pairs. This would produce a more uniform array and smooth out the effects of localized variations in bitline capacitance when generating reference voltages. The additional transistors would defeat column redundancy under some circumstances.

The sense amp data can alternatively be given a Grey-coded representation as shown in the table below. This has the advantage that an error in a cell value that crosses only a single threshold will cause an error in only one bit. Accordingly, this has advantages when using error correction coding.

TABLE

Coding of the allowed sense Amplifier State

| L | R | C | Binary code | Grey code |
|---|---|---|---|---|
| 0 | 0 | 0 | 00 | 00 |
| 0 | 0 | 1 | 01 | 01 |
| 0 | 1 | 1 | 10 | 11 |
| 1 | 1 | 1 | 11 | 10 |

Although the invention has been described with reference to certain specific embodiments, various modifications thereof will be apparent to those skilled in the art without departing from the spirit and scope of the invention as outlined in the claims appended hereto.

What is claimed is:

1. A dynamic random access memory for storing one of N levels in each of a plurality of memory cells, the memory cells having storage capacitors coupled to bitline pairs through switches for writing and reading data to and from the memory cells, the memory comprising:
    (a) an array of at least N-1 bitline pairs, each of the bitline pairs being divided into N-1 sub-bitlines by first switches located therebetween; the sub-bitline pairs of each bitline being coupled to adjacent sub-bitline pairs by second switches located therebetween, to form N-1 groups of N-1 sub-bitlines each group for producing one of N-1 reference voltages;
    (b) sense amplifiers coupled to each of the sub-bitline pairs;
    (c) reference cells for selectively coupling to N-1 of the sub-bitline pairs;
    (d) generate cells for selectively coupling to a remaining (N-2)(N-1) of the sub-bitline pairs;
    wherein each of the sub-bitline pairs in a group are precharged to one of a plurality of voltages, one of the (N-1) reference voltages is generated by shorting together sub-bitlines in the group, and the reference voltage is stored in a reference cell in one of the bit-line pairs in the group.

2. A memory as defined in claim 1, said plurality of voltages being selected from one of VDD, VSS and VBLP.

3. A method for creating a dynamic random access memory for storing one of N levels n each of a plurality of memory cells, comprising the steps of:
    (a) arranging N-1 bit lines pairs in horizontal rows;
    (b) dividing each N-1 bit line pair in (N-) sub-bit line pairs to form (N-1) vertical sub-bitline groups;
    (c) generating one of (N-1) reference voltages in each vertical group by change sharing across the sub-bitlines in that group;
    (d) storing the generated reference voltage for each vertical group in at least one sub-bitline in that group;
    (e) selecting a memory cell in a bitline; and
    (f) comparing the stored reference voltage in each sub-bitline group to the voltage of the selected memory cell, to thereby simultaneously compare said cell to all voltage reference levels.

4. A method as defined in claim 3, said comparing step being performed by sense amplifiers.

5. A method as defined in claim 4, said sense amplifiers producing a binary output indicative of said comparison.

6. A method as defined in claim 5, said binary output being decoded by a decoder.

7. A method as defined in claim 4, using at least N-1 sense amplifiers for performing said comparison.

8. A method as defined in claim 5, wherein said binary output comprises N-1 bits.

* * * * *